(12) United States Patent
Weimer et al.

(10) Patent No.: US 6,972,223 B2
(45) Date of Patent: Dec. 6, 2005

(54) USE OF ATOMIC OXYGEN PROCESS FOR IMPROVED BARRIER LAYER

(75) Inventors: Ronald A. Weimer, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/805,911

(22) Filed: Mar. 15, 2001

(65) Prior Publication Data

US 2002/0132397 A1  Sep. 19, 2002

(51) Int. Cl.[7] ......................................... H01L 21/8238
(52) U.S. Cl. ........................ 438/199; 438/135; 257/204
(58) Field of Search ................................ 438/199, 135, 438/153, 154, 201, 627; 257/204

(56) References Cited

U.S. PATENT DOCUMENTS

| | | | | |
|---|---|---|---|---|
| 3,571,914 A | * | 3/1971 | Lands et al. ................. | 438/143 |
| 4,994,404 A | * | 2/1991 | Sheng et al. ................. | 438/297 |
| 5,144,391 A | * | 9/1992 | Iwata et al. .................. | 257/190 |
| 5,607,874 A | * | 3/1997 | Wang et al. ................. | 438/397 |
| 5,716,875 A | * | 2/1998 | Jones et al. ...................... | 438/3 |
| 5,741,737 A | | 4/1998 | Kachelmeier | |
| 5,840,600 A | * | 11/1998 | Yamazaki et al. .......... | 438/151 |
| 5,994,749 A | | 11/1999 | Oda | |
| 6,064,098 A | | 5/2000 | Honeycutt et al. | |
| 6,156,647 A | | 12/2000 | Hogan | |
| 6,163,060 A | | 12/2000 | Gardner et al. | |
| 6,166,428 A | * | 12/2000 | Mehta et al. ................. | 257/636 |
| 6,242,343 B1 | | 6/2001 | Yamazaki et al. | |
| 6,288,438 B1 | * | 9/2001 | Mizuhara et al. ........... | 257/634 |
| 6,326,287 B1 | * | 12/2001 | Asahina et al. .............. | 438/584 |
| 6,331,495 B1 | * | 12/2001 | Becker ........................ | 438/774 |
| 6,342,421 B1 | * | 1/2002 | Mitani et al. ................ | 438/300 |
| 6,348,706 B1 | * | 2/2002 | Sandhu ........................ | 257/296 |
| 6,358,802 B1 | * | 3/2002 | Oda ............................ | 438/301 |
| 6,383,896 B1 | * | 5/2002 | Kirimura et al. ............ | 438/478 |
| 6,395,623 B1 | * | 5/2002 | Juengling .................... | 438/533 |
| 6,455,884 B1 | | 9/2002 | Chan et al. | |
| 6,461,982 B2 | * | 10/2002 | DeBoer et al. .............. | 438/778 |
| 6,541,278 B2 | * | 4/2003 | Morita et al. .................. | 438/3 |
| 6,566,210 B2 | * | 5/2003 | Ajmera et al. .............. | 438/303 |
| 6,624,445 B2 | * | 9/2003 | Miyanaga et al. ............ | 257/66 |
| 6,657,284 B1 | * | 12/2003 | Li et al. ...................... | 257/649 |
| 2001/0011754 A1 | * | 8/2001 | Koike et al. ................. | 257/379 |
| 2002/0033483 A1 | * | 3/2002 | Takemura .................... | 257/59 |
| 2003/0205772 A1 | * | 11/2003 | Schaeffer et al. ........... | 257/411 |

* cited by examiner

*Primary Examiner*—George Fourson
*Assistant Examiner*—Fernando L. Toledo
(74) *Attorney, Agent, or Firm*—Dickstein Shapiro Morin & Oshinsky LLP

(57) ABSTRACT

A composite barrier layer formed between a glass film and active regions of a memory device is disclosed. The composite barrier layer comprises an oxide layer formed by atomic deposition process and an insulating layer, for example a nitride barrier layer, formed over the oxide layer. The composite barrier layer eliminates the diffusion of impurity atoms from the glass film into the active regions of the device.

50 Claims, 11 Drawing Sheets

USE OF ATOMIC OXYGEN PROCESS FOR IMPROVED BARRIER LAYER

FIELD OF THE INVENTION

The present invention relates to the field of semiconductor devices and, in particular, to a method of increasing the performance of such devices.

BACKGROUND OF THE INVENTION

The integration of a large number of components on a single IC chip requires complex interconnects. Ideally, the interconnect structures should be fabricated with minimal signal delay and optimal packing density. Because of their increasing importance, the qualities of the interconnect structures drastically affect the reliability and performance of fabricated integrated circuits. Currently, the reliability of electrical contacts are increasingly defining the limits in performance and density of modern very-large scale integrated (VLSI) circuits.

A conventional pair of transistors for integrated memory cells is illustrated in FIG. 1. Respective access transistors 33 are formed within a well 13 of a semiconductor substrate 12. The well and transistors are surrounded by a field oxide region 14 that provides isolation. The pair of access transistors have respective gate stacks 30, which include an oxide layer 18, a conductive layer 20, such as polysilicon, and a nitride cap 22.

Insulating spacers such as the nitride spacers 32 of FIG. 1 are typically formed on sidewalls of the gate stacks 30 to provide electrical insulation of the gate stacks 30 and source/drain regions 40. The nitride spacers 32 are also employed in the formation of lightly doped drain (LLD) regions 42 (FIG. 1) between the source/drain regions 40 in the semiconductor substrate 12 and the channel region beneath the gate stacks 30. As known in the art, source/drain regions 40 are formed by doping the semiconductor substrate 12 after formation of the nitride spacers 32 with the same type of dopant used to form the LLD regions 42, but with a heavier dosage (either P+ or N+).

After formation of the source/drain regions 40, a polysilicon plug 21 (FIG. 2) is typically formed in a contact opening of an insulating layer 24 (FIG. 2), to directly connect to a source or drain region 40 of the semiconductor device. For simplicity, FIG. 2 illustrates only a partial middle view of the structure of FIG. 1. The insulating layer 24 (FIG. 2) could be, for example, borophosphosilicate glass (BPSG), borosilicate glass (BSG), or phosphosilicate glass (PSG). Once the polysilicon plug 21 is formed, the whole structure, including the substrate 12 with the gate stacks 30, is chemically or mechanically polished to provide a planarized surface. As known in the art, additional contact openings or vias are formed over the polysilicon plug so that a metal layer bit line or metal electrode of a capacitor plate, for example, may then be deposited and patterned to contact with the polysilicon plug.

The insulating layer 24 (FIG. 2) is typically composed of a borophosphosilicate glass (BPSG) or a non-doped silicate glass (NSG), which is formed over the gate stacks 30 and the source/drain regions 40 by deposition, for example, and then undergoes a thermal treatment to facilitate the planarizing of the insulating material. Since the thermal treatment of the insulating layer 24 typically requires temperatures higher than 500° C., boron (B) and/or phosphorous (P) atoms from the BPSG insulating layer 24 migrate into the adjacent source/drain regions 40 and under the nitride spacers 32 in the LDD regions 42 during these high-temperature steps. Although the boron/phosphorous migration into the source/drain regions 40 occurs in limited regions, near or at a source/drain-BPSG interface 51 (FIG. 2), this interface is degraded and the performance of the device affected. A major drawback posed by the migration of impurity boron/phosphorous atoms at the source/drain-BPSG interface 51 is the decrease in the "refresh time" of the DRAM device, and consequently an increase in the DRAM error rate. The "refresh time" of a DRAM cell is defined as the length of time over which the DRAM cell can retain a sufficient amount of charge for its intended data state to be determined by a sense amplifier circuit. Before this period of time expires, the DRAM cell must be reprogrammed or "refreshed" and, consequently, it is desirable that the refresh time between the refresh operations be as long as possible.

Barrier layers have been introduced in an attempt to minimize the boron/phosphorous diffusion at the source/drain-BPSG interface 51 (FIG. 2). For example, a composite barrier layer 52 (FIG. 3) comprising a tetraethylorthosilicate TEOS liner 52a and a nitride liner 52b is illustrated in FIG. 3. While the composite barrier layer 52 suppresses the diffusion of the boron/phosphorous impurity atoms at the source/drain-BPSG interface 51, there is a problem in that the deposition of the TEOS liner 52a is highly non-conformal. In addition, the formation of the TEOS liner 52a typically employs a TEOS precursor gas; however, this TEOS precursor gas is not pure and contains many impurity atoms, for example carbon (C) impurities, which further diffuse into the active regions 40, 42. Nitride liners, such as a silicon nitride ($Si_3N_4$) barrier layer, disposed directly over the source/drain regions 40 also pose problems in that the mobility of the silicon (Si) atoms in the semiconductor substrate 12 is greatly degraded as a result of the $Si_3N_4$/Si interface, which as known in the art, increases the electrical resistance in the electrical connection region.

Accordingly, there is a need for an improved method for preventing the migration of impurity atoms into the active regions of a DRAM device, as well as a method for increasing the refresh time and reducing the error rate of such DRAM devices. There is also a need for a novel barrier layer that would prevent the occurrence of the above-mentioned problems.

BRIEF SUMMARY OF THE INVENTION

The present invention provides a composite barrier layer formed between a glass insulating layer and active regions of a memory device, for example a DRAM device, to eliminate the diffusion of impurity atoms from the glass insulating layer into the active regions of the device.

The composite barrier layer comprises an oxide layer formed by atomic deposition process and an insulating layer, for example a nitride barrier layer, formed over the oxide layer.

These and other features and advantages of the invention will be more apparent from the following detailed description which is provided in connection with the accompanying drawings, which illustrate exemplary embodiments of the invention.

DETAILED DESCRIPTION OF THE INVENTION

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has a semiconductor surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Figure 1:
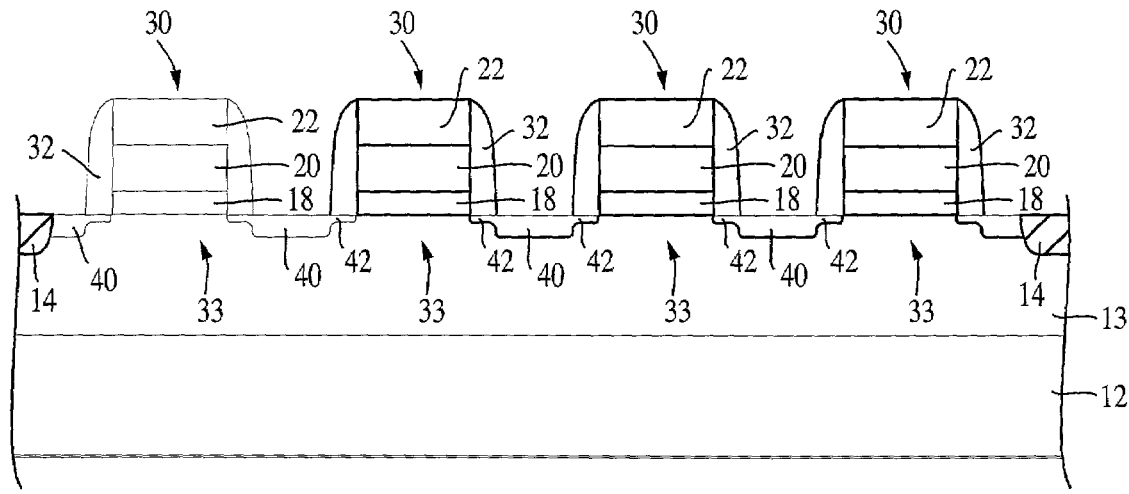
FIG. 1 illustrates a cross-sectional view of a conventional DRAM device at an intermediate stage of processing and in accordance with the prior art.
Figure 2:
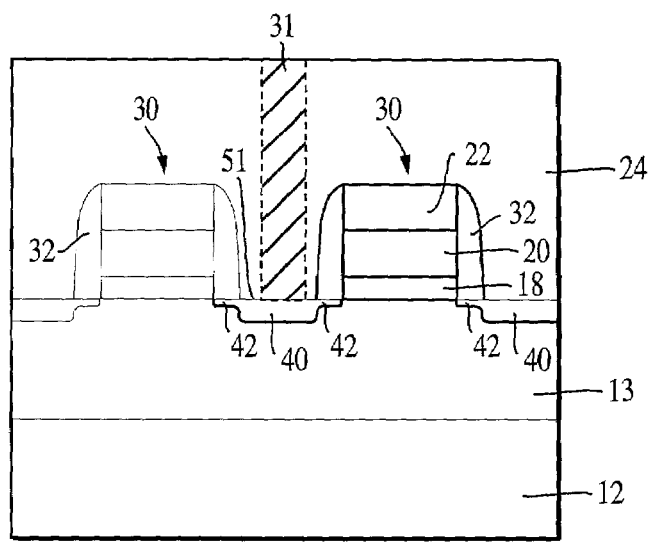
FIG. 2 illustrates a cross-sectional partial middle view of the DRAM device of FIG. 1 at a stage of processing subsequent to that shown in FIG. 1.
Figure 3:
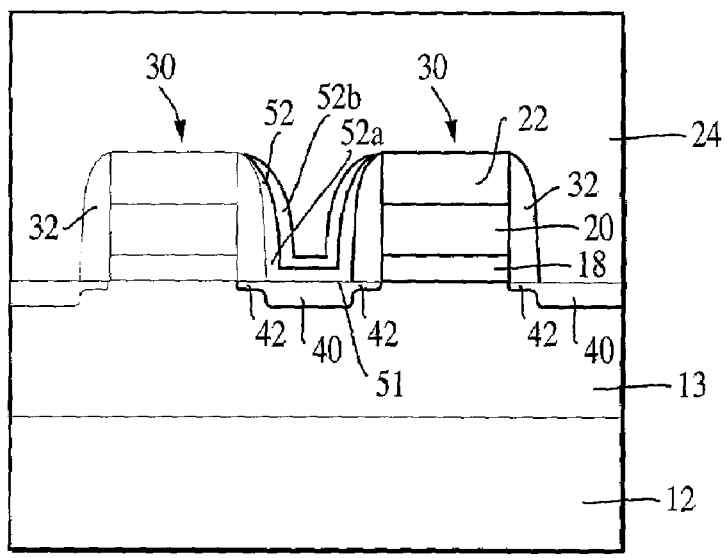
FIG. 3 illustrates a cross-sectional view of the DRAM device of FIG. 2 at a stage of processing subsequent to that shown in FIG. 2.
Figure 4:
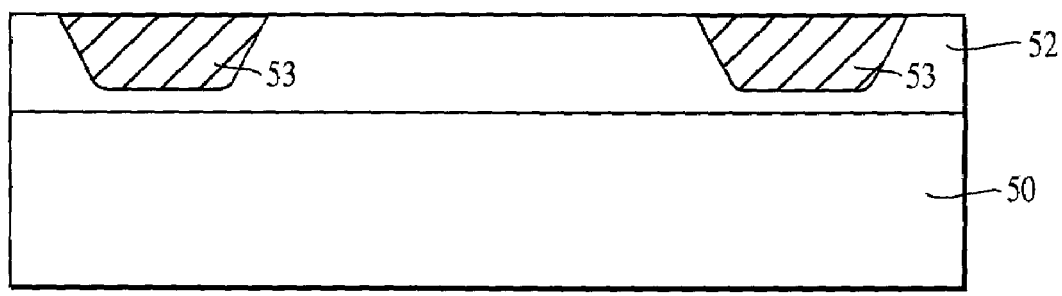
FIG. 4 illustrates a cross-sectional view of a DRAM device at an intermediate stage of processing, wherein a barrier composite layer will be constructed in accordance with an embodiment of the present invention.

Referring now to the drawings, where like elements are designated by like reference numerals, FIGS. 4–20 illustrate a method of forming a composite barrier layer 100 (FIGS. 15–19) according to exemplary embodiments of the present invention. FIG. 4 illustrates a semiconductor substrate 50 having a well 52, which is typically doped to a predetermined conductivity, for example P-type or N-type, depending on whether NMOS or PMOS transistors will be formed therein. For the purposes of the present invention, the well 52 is considered to be a P-well formed by implanting P-type impurity atoms, such as boron, for example, by known methods of the art.

The structure of FIG. 4 further includes isolation regions 53, which, as known in the art, may be field oxide (FOX) regions or shallow trenches for isolation (STI), for example. In an exemplary embodiment, the isolation regions 53 are shallow trenches for isolation filled with high density plasma (HDP) oxide, a material which has a high ability to effectively fill narrow trenches. Alternatively, an insulating layer (not shown) formed of an oxide or of silicon nitride, for example, may be formed on the trench sidewalls, prior to filling the trenches with the isolation dielectric, to aid in smoothing out the corners in the bottom of the trenches and to reduce the amount of stress in the dielectric used to later fill in the trenches.

Figure 5:
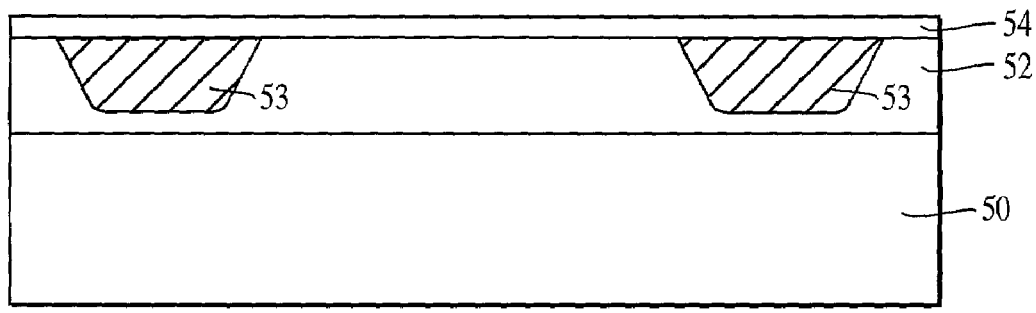
FIG. 5 illustrates a cross-sectional view of the DRAM device of FIG. 4 at a stage of processing subsequent to that shown in FIG. 4.

Subsequent to the formation of the isolation regions 53 (FIG. 4), a thin gate oxide layer 54, which will act as a gate insulator layer, is formed over the semiconductor substrate 50 including the isolation regions 53, as shown in FIG. 5. The thin gate oxide layer 54 may comprise silicon dioxide ($SiO_2$), for example, which may be thermally grown in an oxygen ambient, at a temperature between about 600° C. to about 1,000° C. and to a thickness of about 30 Angstroms to about 100 Angstroms.

Figure 6:
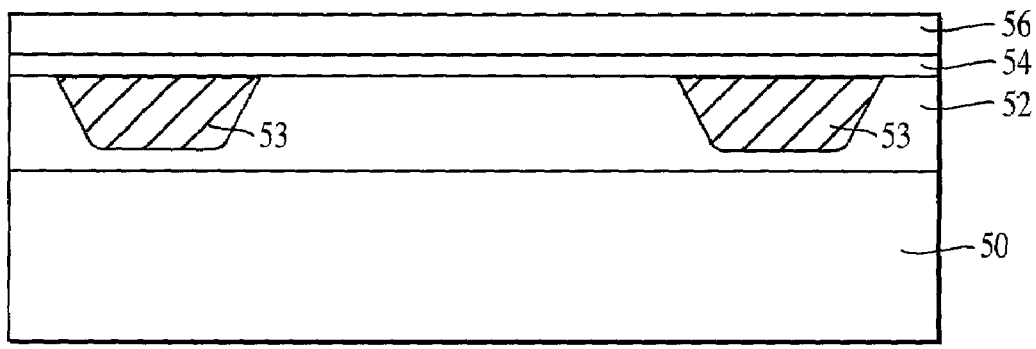
FIG. 6 illustrates a cross-sectional view of the DRAM device of FIG. 4 at a stage of processing subsequent to that shown in FIG. 5.

A polysilicon layer 56 is then formed over the thin gate oxide layer 54, as illustrated in FIG. 6. The polysilicon layer 56 may be deposited over the thin gate oxide layer 54 via LPCVD procedures, at a temperature of about 300° C. to about 700° C., and to a thickness of about 100 Angstroms to about 2,000 Angstroms. The polysilicon layer 56 may be doped in situ during deposition with arsine or phosphine in a silane ambient, or the polysilicon layer 56 may be deposited intrinsically and then doped by ion implantation of arsenic or phosphorous ions. After its deposition, the polysilicon layer 56 may be planarized by chemical mechanical polishing (CMP), for example, but other suitable methods could be used also, as desired.

Figure 7:
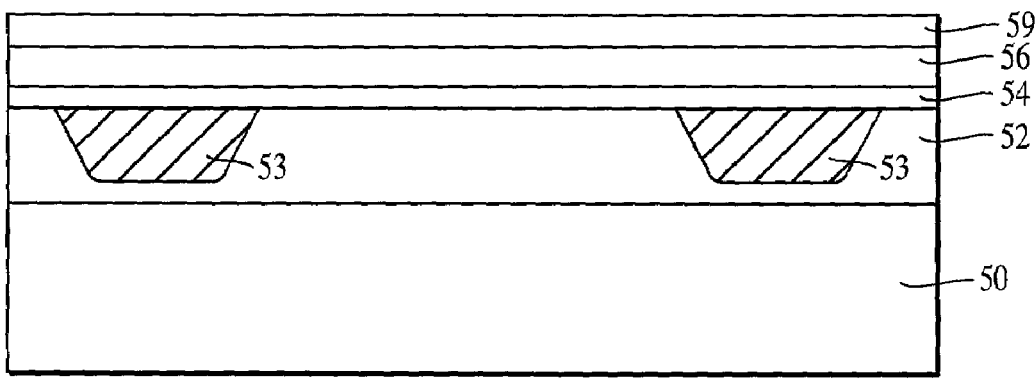
FIG. 7 illustrates a cross-sectional view of the DRAM device of FIG. 4 at a stage of processing subsequent to that shown in FIG. 6.

In an exemplary embodiment of the invention, silicide regions 59 may be formed over the polysilicon layer 56, as illustrated in FIG. 7. If the silicide regions are desired, a layer of metal capable of forming a silicide (not shown) may be deposited over the polysilicon layer 56 (FIG. 6) by sputtering by RF or DC or by other similar methods such as CVD, to a thickness of about 200 Angstroms to about 500 Angstroms. Subsequent to the deposition of the metal capable of forming a silicide, semiconductor substrate 50 undergoes a rapid thermal anneal (RTA), typically for about 10 to 60 seconds, using a nitrogen ambient, at about 600° C. to about 850° C. so that the metal in direct contact with the polysilicon layer 56 is converted to its silicide. As shown in FIG. 7, silicide regions 59 form conductive regions on top of the polysilicon layer 56. Preferably, the refractory metal has low resistance and low resistivity as a silicide. However, the refractory metal silicide may comprise any refractory metal, including but not limiting to titanium, cobalt, tungsten, tantalum, molybdenum, and platinum.

Figure 8:
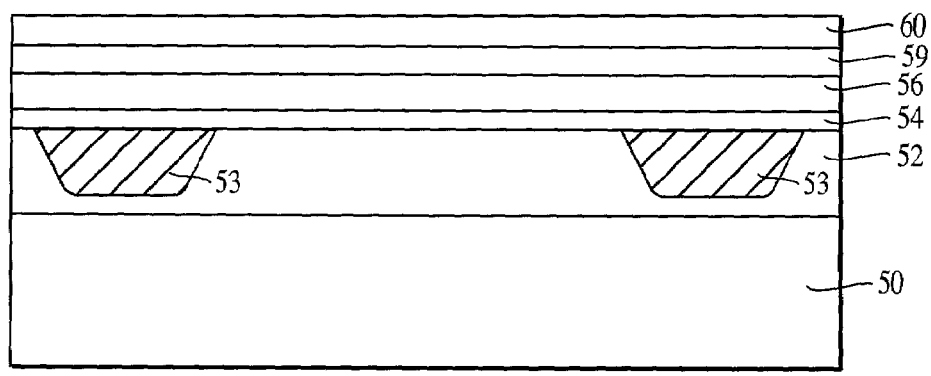
FIG. 8 illustrates a cross-sectional view of the DRAM device of FIG. 4 at a stage of processing subsequent to that shown in FIG. 7.
Figure 9:
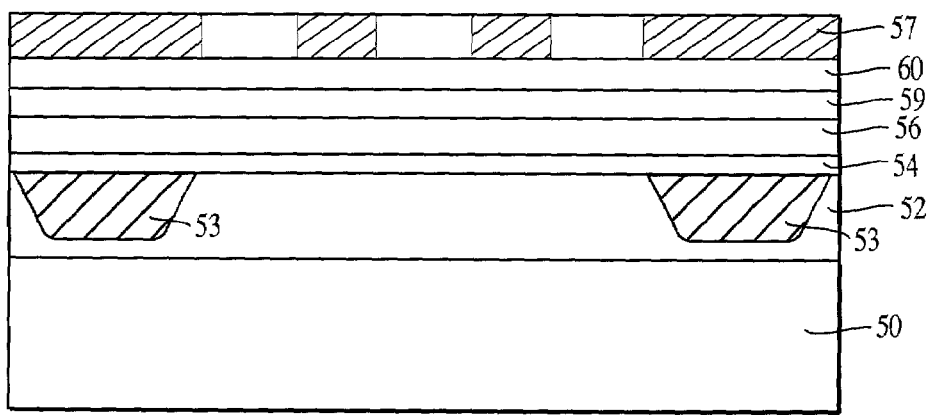
FIG. 9 illustrates a cross-sectional view of the DRAM device of FIG. 4 at a stage of processing subsequent to that shown in FIG. 8.

Although the following processing steps for the completion of the gate stacks 70 (FIG. 11) will refer to and illustrate the silicide regions 59 formed over the polysilicon layer 56, it must be understood that the present invention is not limited to this embodiment, and other embodiments such as the formation of gate stacks without a silicide layer on the polysilicon gate, are also contemplated. In any event, a cap material 60 is formed over the silicide regions 59 as shown in FIG. 8. The cap material may be formed of silicon dielectrics such as silicon nitride or silicon oxide, but TEOS or carbides may be used also. The cap material 60 may be formed via PECVD deposition procedures, for example, at a temperature between about 300° C. to about 600° C., to a thickness of about 1,000 Angstroms to about 2,000 Angstroms.

Figure 10:
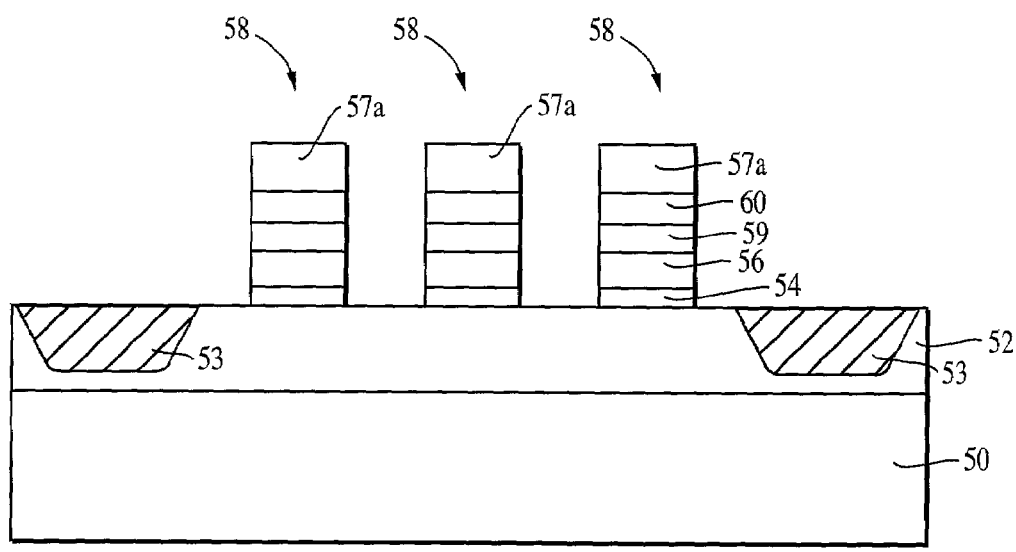
FIG. 10 illustrates a cross-sectional view of the DRAM device of FIG. 4 at a stage of processing subsequent to that shown in FIG. 9.

Next, the structure of FIG. 8 is patterned using a photoresist layer 57 (FIG. 9) formed over the cap material 60 to a thickness of about 1,000 Angstroms to about 10,000 Angstroms. The photoresist layer 57 is patterned with a mask (not shown) and the thin gate oxide layer 54, the polysilicon layer 56, the silicide region 59 and the cap material 60 are anisotropically etched through the patterned photoresist to obtain a plurality of polysilicon gates 58 having on top portions 57a of the photoresist layer, as shown in FIG. 10. Subsequent to the formation of the polysilicon gates 58, the top portions 57a of the photoresist layer are removed by conventional techniques, such as oxygen plasma, for example, or by flooding the semiconductor substrate 50 with UV irradiation to degrade portions 57a of the photoresist layer and obtain gate stacks 70 of FIG. 11.

Figure 11:
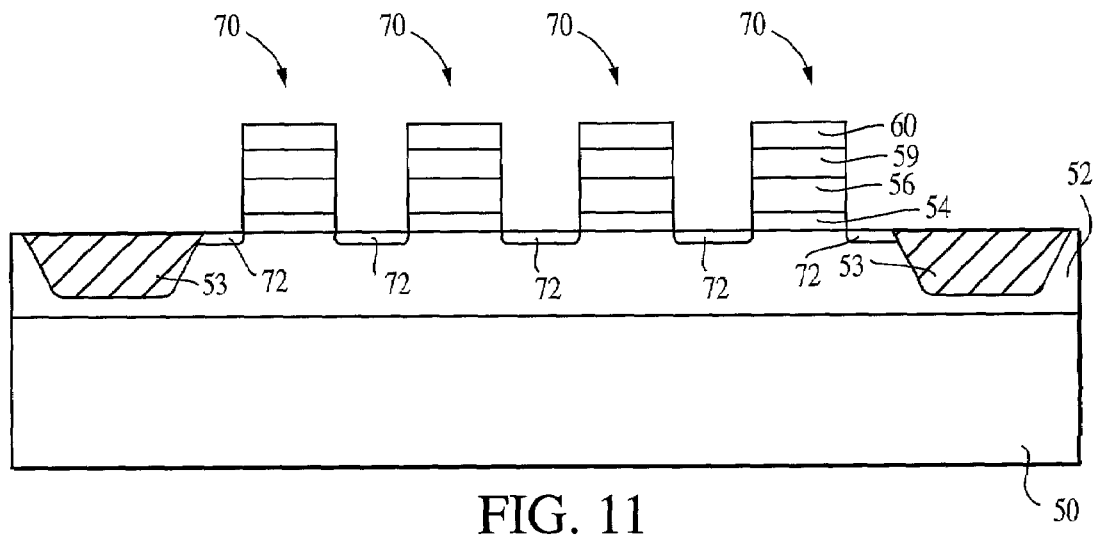
FIG. 11 illustrates a cross-sectional view of the DRAM device of FIG. 4 at a stage of processing subsequent to that shown in FIG. 10.

As illustrated in FIG. 11, each of the gate stacks 70 comprises the thin gate oxide layer 54, the polysilicon layer 56, the silicide region 59 and the nitride cap 60. The gate stacks 70 may now be used in a conventional implant process where the gate stacks are needed to mask the dopant implantation of source/drain regions 82 (FIG. 13) of the adjacent transistors defined by the gate stacks. As such, FIG. 11 illustrates the formation of lightly doped drain (LDD) regions 72 in the semiconductor substrate 50. As known in the art, the LDD regions 72 may be formed by implanting low dosages of conductivity-altering dopants with an LDD mask (not shown) or using the gate stacks 70 as an implantation mask. Thus, in the P-well 52 of the semiconductor substrate 50, N-type dopants such as arsenic or phosphorous may be implanted at a low energy dose, for example of about $1 \times 10^{15}$ atoms/cm², using the gate stacks 70 as a mask.

Figure 12:
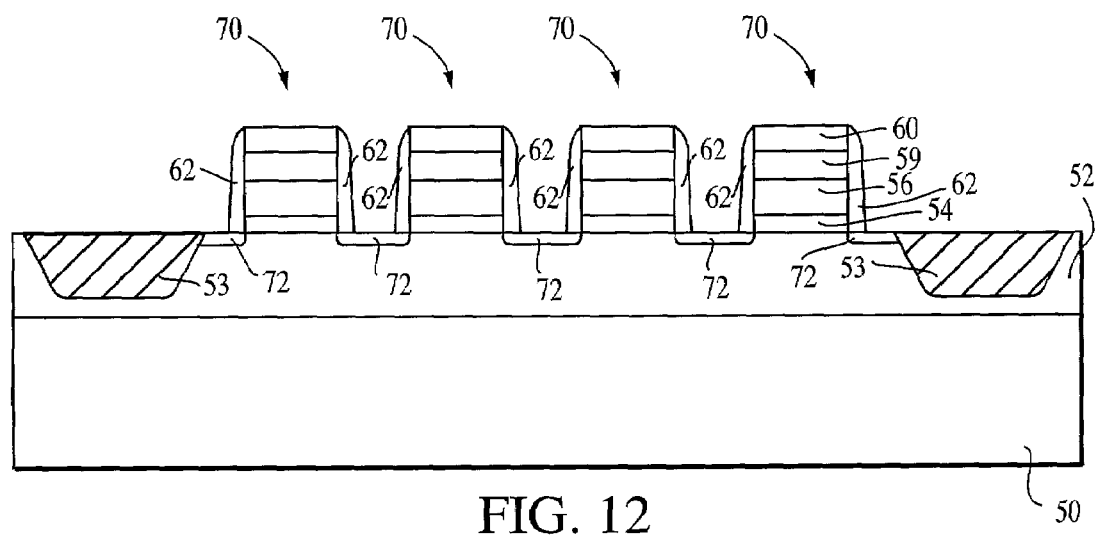
FIG. 12 illustrates a cross-sectional view of the DRAM device of FIG. 4 at a stage of processing subsequent to that shown in FIG. 11.

The next step in the process flow is the formation of spacers 62 illustrated in FIG. 12. Spacers 62 may be formed, for example, by depositing a silicon nitride film or a silicon oxide material over the structure of FIG. 11 and then anisotropically etching with an RIE plasma to form the spacers 62 on each of the sidewalls of the gate stacks 70.

The gate stacks 70 protected by spacers 62 can now undergo conventional processing steps for the formation of source/drain regions in the semiconductor substrate 50. As such, using the gate stacks 70 as an implantation mask, heavily doped source/drain regions 82 are formed in the uncovered portions of the semiconductor substrate 50 via an ion implantation procedure performed at an energy of about 50 KeV to about 70 KeV, and at a dose of about $2 \times 10^{15}$ to about $5 \times 10^{15}$ atoms/cm², using arsenic or phosphorous, for example. Thermal annealing for activation may be carried out in a nitrogen atmosphere at about 1000° C. for about 10 minutes.

Subsequent to the formation of the source/drain regions 82 (FIG. 13), the semiconductor substrate 50 is introduced in a furnace 200 to form the composite barrier layer 100 (FIGS. 15–19) according to a method of the present invention. The furnace 200, which is schematically illustrated in FIG. 20, is provided with one or more gas feeds 202 for providing reaction and other ambient gases to the furnace chamber. Chamber pressure is maintained by pumping through vacuum port 203. A heater 204, typically operating under computer control, maintains the chamber at desired temperatures and alters the temperature of the chamber in a controlled manner. One or more substrates are loaded onto a carrier or boat 206 for transport into and out of the furnace 200. The substrates include the semiconductor substrate 50 (FIGS. 4–13) at an intermediate stage of processing with the appropriate source/drain regions of field effect transistors formed in and on it.

Figure 13:
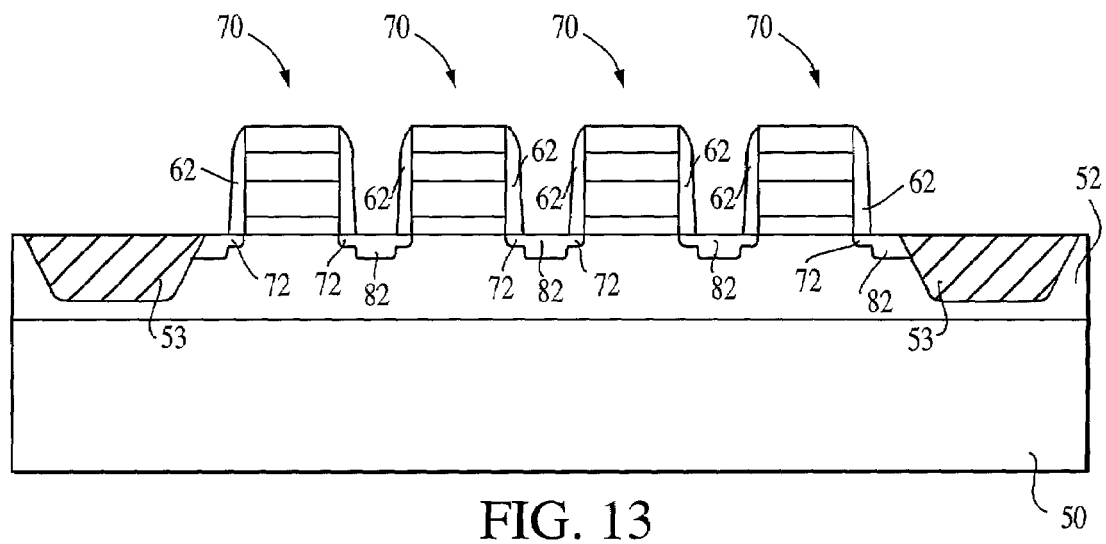
FIG. 13 illustrates a cross-sectional view of the DRAM device of FIG. 4 at a stage of processing subsequent to that shown in FIG. 12.
Figure 14:
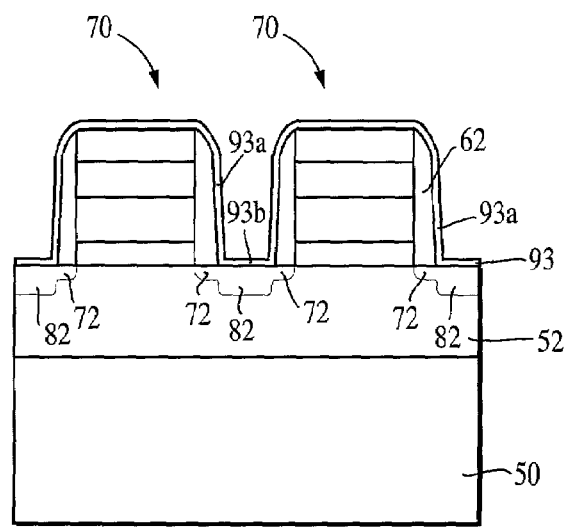
FIG. 14 illustrates a partial middle cross-sectional view of the DRAM device of FIG. 13 at a stage of processing subsequent to that shown in FIG. 13.

Reference is now made to FIG. 14, which, again, for simplicity illustrates only the middle portion of the structure of FIG. 13. The semiconductor substrate 50 is introduced into the furnace 200 of FIG. 20 to undergo an atomic oxygen process. This way, an oxide layer 93 (FIG. 14) is formed over the structure of FIG. 13, to a thickness of about 20 Angstroms to about 500 Angstroms, more preferably of about 50 Angstroms to about 100 Angstroms. The oxide layer 93 may be grown, for example, at a temperature of about 850° C. to 1100° C., preferably at a temperature less than about 900° C., for about 1 second to about 10 minutes, using a gas ambient containing atomic oxygen. The atomic oxygen can be supplied by in situ steam generation. In other words, a combination of $O_2$ and $H_2$ at a hot wafer surface, or a surface in close proximity, is utilized wherein steam and atomic oxygen is formed and available for oxidation. Also, atomic oxygen can be supplied by an ozone source, plasma source, microwave source or photoexcitation.

In any event, the thickness of the portions 93a (FIG. 14) of the oxide layer 93, that are formed over the spacers 62 of the gate stacks 70, is of about 60% of the targeted thickness of the portions 93b (FIG. 14) of the oxide layer 93, which are formed overlying the source/drain regions 93. The thickness of the portions 93a, of about 60% of the targeted thickness, is very high compared to a typical resulting thickness in a conventional method, such as wet oxidation without utilizing atomic oxygen. In a conventional method, the resulting thickness of portions 93b is of about 1% to 3% of the targeted thickness of the portions 93a. Targeted thickness is defined in the present application as any suitable and/or desired thickness for the portion 93b of the oxide layer 93. Thus, if the targeted thickness of portions 93b of the oxide layer 93 is of about 80 Angstroms, the thickness of portion 93a of the oxide layer 93 is of about at least 60% of the thickness of portion 93b, that is of about 48 Angstroms.

A cleaning step may be employed, if desired, subsequent to the formation of the source/drain regions 82 and prior to the formation of the oxide layer 93 by the atomic oxygen process described above. If a cleaning step is desired, the exposed silicon surfaces of the structure of FIG. 13 are cleaned so that any impurities and/or residues are removed. Any soft etch, such as a downstream plasma processing using NF$_3$ as an etchant and/or a wet etch may be employed to clean the exposed silicon surfaces of the semiconductor substrate 50.

Figure 15:
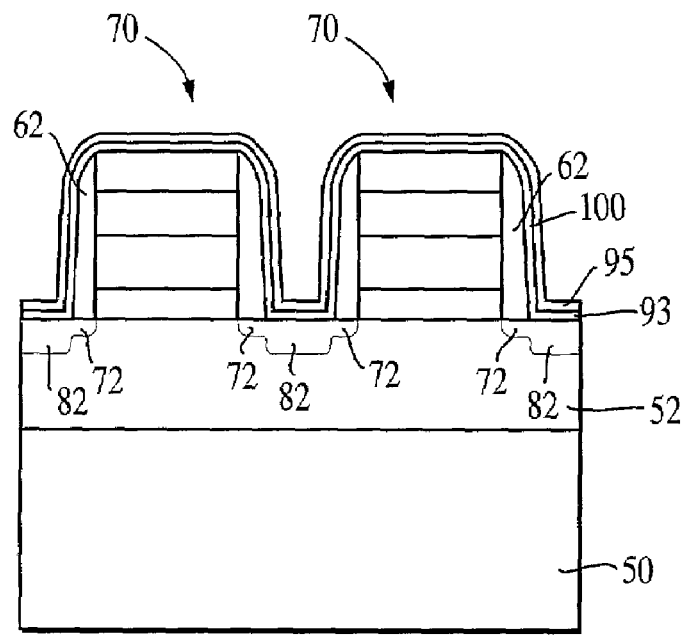
FIG. 15 illustrates a cross-sectional view of the DRAM device of FIG. 14 at a stage of processing subsequent to that shown in FIG. 14.

Subsequent to the formation of the oxide layer 93 (FIG. 14) by atomic oxygen processing, a barrier layer 95 is formed over the oxide layer 93 to complete the formation of the composite barrier layer 100, as shown in FIG. 15. In an exemplary embodiment of the present invention, the barrier layer 95 may be formed of an insulating material, such as silicon nitride (Si$_3$N$_4$), with a thickness of about 30 Angstroms to about 150 Angstroms, more preferably of about 50 Angstroms to about 100 Angstroms. If silicon nitride is employed, the barrier layer 95 may be formed by known deposition processes such as sputtering by chemical vapor deposition (CVD) or low temperature deposition by electron cyclotron resonance plasma enhanced CVD, among others. Although reference to the barrier layer 95 will be made as to the nitride barrier layer 95, it must be understood that the insulating material may be also formed of oxynitrides, silicon oxides, such as SiO or SiO$_2$, silicon carbides, or other insulating materials, for example a high temperature polymer, such as a polyimide, or a low dielectric constant inorganic material, and thus the invention is not limited to the use of silicon nitride.

Figure 16:
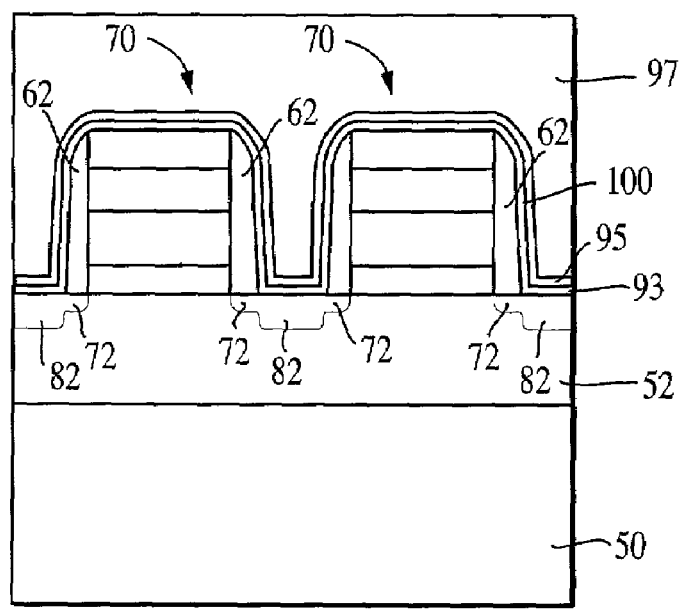
FIG. 16 illustrates a cross-sectional view of the DRAM device of FIG. 14 at a stage of processing subsequent to that shown in FIG. 15.
Figure 19:
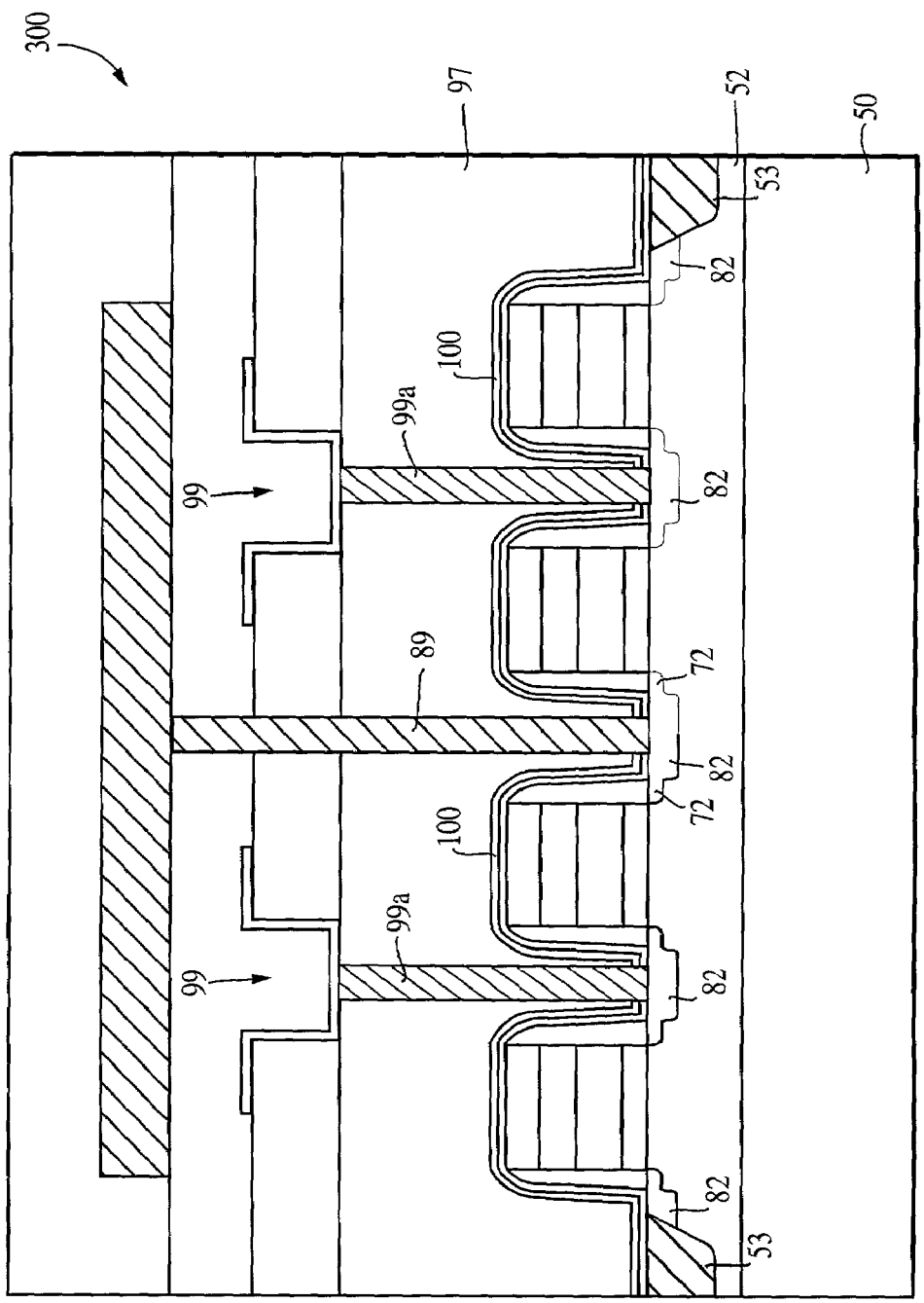
FIG. 19 illustrates a cross-sectional view of the DRAM device of FIG. 4 at a stage of processing subsequent to that shown in FIG. 18.
Figure 20:
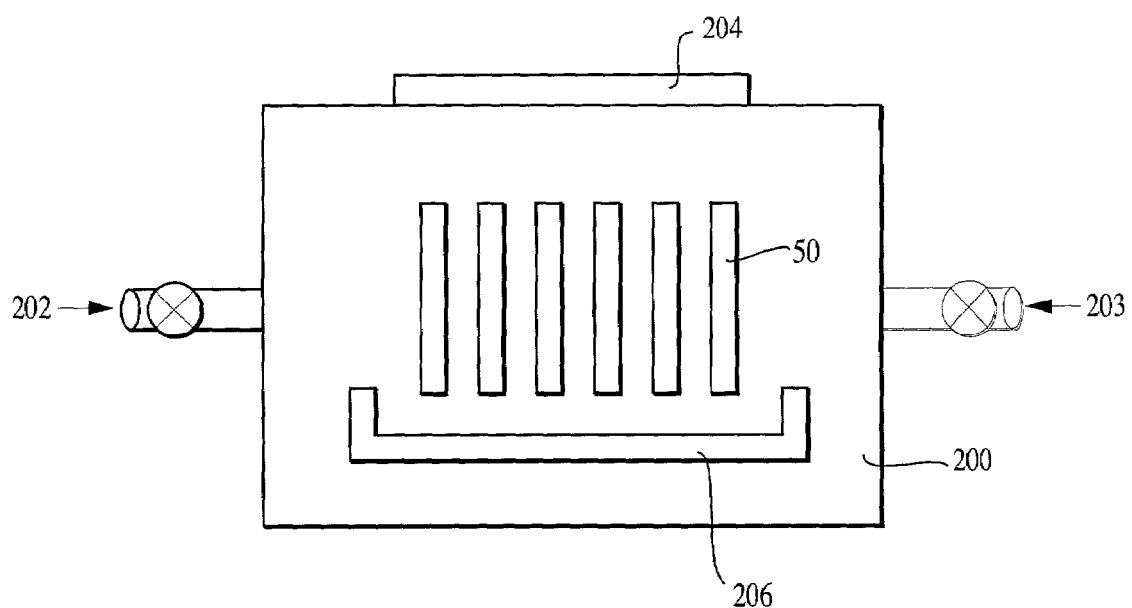
FIG. 20 illustrates a furnace for forming the composite barrier layer of the present invention.

Once the formation of the barrier layer 100 (FIG. 15) is completed, the gate stacks 70 can undergo conventional processing steps for the formation of an underlying insulating layer 97 and contact openings for conductors and/or capacitors, as well as other interconnect structures, necessary to produce a semiconductor device such as the DRAM memory device 300 (FIG. 19). As such glass insulating layer 97 is formed over the composite barrier layer 100, as illustrated in FIG. 16. In an exemplary embodiment, the glass insulating layer 97 is formed of a glass film doped with boron (B) or phosphorous (P), such as borophosphosilicate glass (BPSG) or phosphosilicate glass (PSG), for example. The glass insulating layer 97 may be formed by normal CVD or LPCVD processes using tetraethylorthosilicate (TEOS) as a source to a thickness of about 1,000 Angstroms to about 5,000 Angstroms.

In an exemplary embodiment of the invention, the glass insulating layer 97 undergoes a thermal anneal treatment at high temperatures necessary to facilitate the planarization of the glass film layer 97. The high anneal temperatures facilitate the migration of the boron/phosphorous dopant atoms from the BPSG/PSG glass insulating layer 97 into the active regions 72, 82 of the semiconductor substrate 50. The composite barrier layer 100 prevents, however, the diffusion of boron and/or phosphorous atoms from the glass insulating layer 97 into the source/drain regions 82 at high temperatures. Thus, since there is no glass insulating layer-source/drain regions interface, the migration of the boron and/or phosphorous atoms from the glass insulating layer 97 into the source/drain regions 82 and/or under the spacers 62 and into the LDD regions 72 is eliminated and the "refresh time" of the device is not affected negatively.

Figure 17:
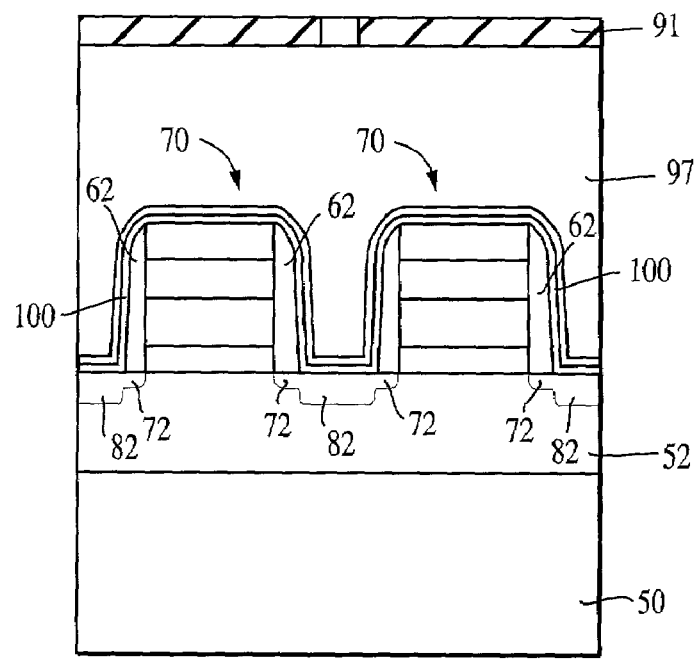
FIG. 17 illustrates a cross-sectional view of the DRAM device of FIG. 14 at a stage of processing subsequent to that shown in FIG. 16.
Figure 18:
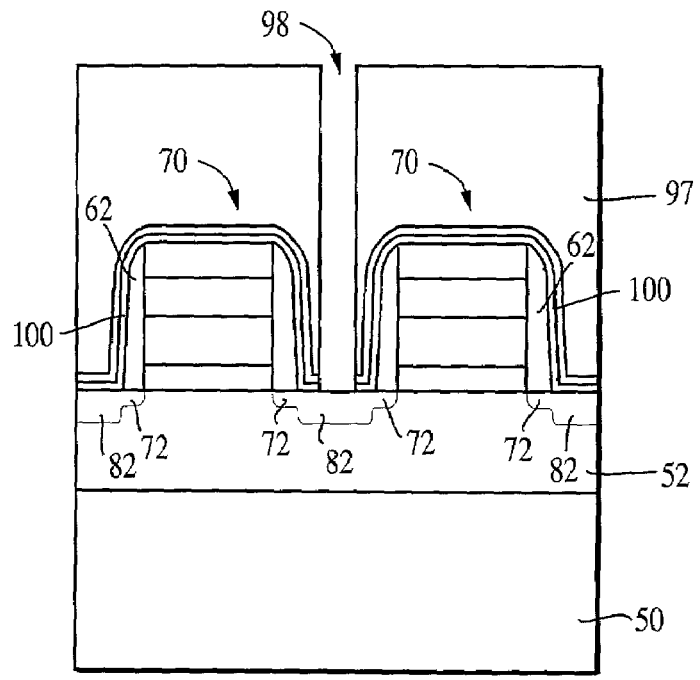
FIG. 18 illustrates a cross-sectional view of the DRAM device of FIG. 14 at a stage of processing subsequent to that shown in FIG. 17.

To create a contact opening 98 (FIG. 18) through the glass insulating layer 97, a photoresist material 91 is deposited and patterned using conventional photolithography steps, as shown in FIG. 17. The glass insulating layer 97 and portions of the composite barrier layer 100 that extend over the source/drain regions 82 are etched by using a wet etch, for example a 30:1 acetic acid/hydrofluoric acid solution, or a dry etch so that contact opening 98 extends to the source/drain regions 82 and exposes the source/drain regions 82, as shown in FIG. 18.

Conventional processing steps can be carried out to form conductors 89 and/or capacitors 99 with associated conductive plugs 99a, all illustrated in FIG. 19, and to complete the formation of a DRAM memory device 300. It must be noted that although all conductors 89 and/or capacitors 99 with the associated conductive plugs 99a are shown in FIG. 19 as being formed through contact openings formed through the composite barrier layer 100, the invention is not limited to this embodiment as long as at least one of all these structures is formed in a contact opening such as the contact opening 98 of FIG. 18.

Figure 21:
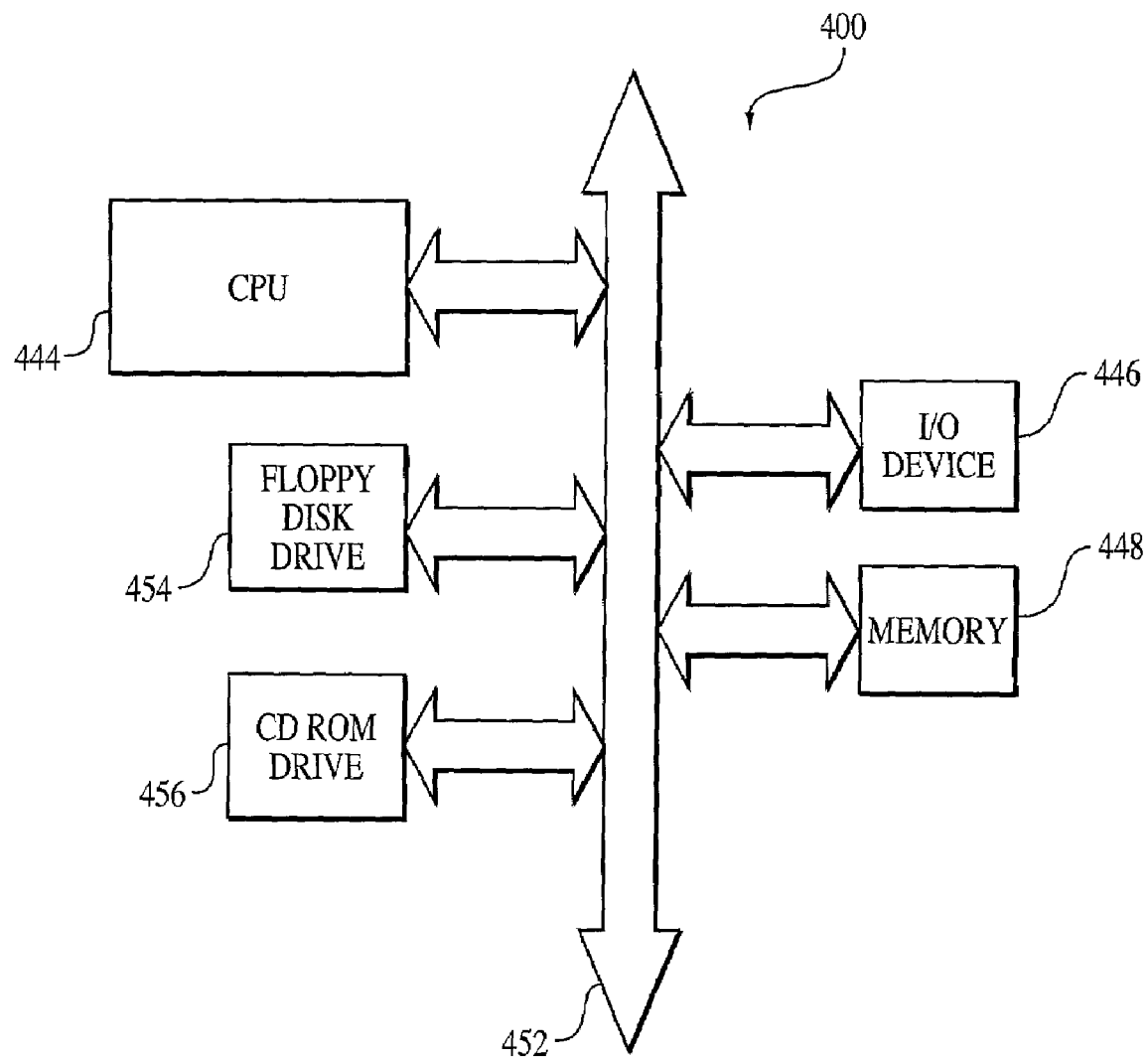
FIG. 21 is a schematic diagram of a processor system incorporating the composite barrier layer of the present invention.

The contact opening 98 formed through the composite barrier layer 100 (FIGS. 15–19) formed in accordance with embodiments of the present invention could be used in any integrated circuit structure such as in a processor-based system 400 (FIG. 21) which includes a memory circuit 448, for example a memory module containing a plurality of DRAM memory devices 300, at least one being the structure illustrated in FIG. 19 which may employ the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A method of forming an integrated structure, comprising:
   forming at least one gate stack structure over a substrate;
   forming a source/drain region in said substrate on opposite sides of said gate stack structure;
   subsequently forming an oxide layer over said source/drain region, said oxide layer having a thickness of about 50 Angstroms to about 100 Angstroms and being formed by oxidizing an upper surface of said source/drain region using atomic oxygen at a temperature of about 850° C. to 1100° C.; and
   forming a barrier layer in contact with said oxide layer.

2. The method of claim 1 further comprising the step of forming a glass layer in contact with said barrier layer of said integrated structure.

3. The method of claim 2, wherein said glass layer is a doped glass film.

4. The method of claim 3, wherein said doped glass film includes BPSG material.

5. The method of claim 3, wherein said doped glass film includes PSG material.

6. The method of claim 1, wherein said oxide layer is grown at a temperature less than about 900° C.

7. The method of claim 1, wherein said oxide layer is grown for about 1 second to about 10 minutes.

8. The method of claim 1, wherein said atomic oxygen is supplied by in situ steam generation.

9. The method of claim 1, wherein said atomic oxygen is supplied by an ozone source.

10. The method of claim 1, wherein said atomic oxygen is supplied by a plasma source.

11. The method of claim 1, wherein said atomic oxygen is supplied by a microwave source.

12. The method of claim 1, wherein said atomic oxygen is supplied by photoexcitation.

13. The method of claim 1, wherein said oxide layer is formed in a batch furnace system.

14. The method of claim 1, wherein said barrier layer is formed of an insulating material selected from the group consisting of silicon nitride, silicon oxide, silicon dioxide, silicon carbide and high temperature polymers.

15. The method of claim 1, wherein said barrier layer is formed to a thickness of about 30 Angstroms to about 150 Angstroms.

16. The method of claim 1, wherein said barrier layer is formed to a thickness of about 50 Angstroms to about 100 Angstroms.

17. The method of claim 1, wherein said oxide layer and said barrier layer are further formed over said gate stack, said gate stack including a plurality of spacers formed on sidewalls of said gate stack structure.

18. A method of forming a memory cell, comprising:
forming a plurality of gate stacks over a substrate, each of said plurality of gate stacks comprising a gate oxide layer and a conductive layer;
forming spacers on sidewalls of each of said plurality of gate stacks;
forming source/drain regions in said substrate on opposite sides of each of said plurality of gate stacks;
subsequently forming a composite barrier layer over said source/drain regions and said plurality of gate stacks said composite barrier layer comprising an oxide layer formed by oxidizing approximately entire upper surfaces of said source/drain regions using atomic oxygen so that said oxide layer has a first oxide portion of a first thickness over said spacers and a second oxide portion over said source/drain regions of a second thickness, said second thickness being greater than said first thickness, and a barrier layer formed over said oxide layer, said barrier layer having a thickness of about 30 Angstroms to about 150 Angstroms;
forming a glass insulating layer in contact with said composite barrier layer;
forming an opening in said glass insulating layer and said composite barrier layer to expose at least a portion of said upper surfaces of said source/drain regions; and
forming a conductor in said opening.

19. The method of claim 18, wherein said oxide layer of said composite barrier layer is grown at a temperature of about 850° C. to 1100 ° C.

20. The method of claim 18, wherein said oxide layer of said composite barrier layer is grown at a temperature less than about 900° C.

21. The method of claim 18, wherein said oxide layer of said composite barrier layer is grown for about 1 second to about 10 minutes.

22. The method of claim 18, wherein said atomic oxygen is supplied by in situ steam generation.

23. The method of claim 18, wherein said atomic oxygen is supplied by an ozone source.

24. The method of claim 18, wherein said atomic oxygen is supplied by a plasma source.

25. The method of claim 18, wherein said atomic oxygen is supplied by a microwave source.

26. The method of claim 18, wherein said atomic oxygen is supplied by photoexcitation.

27. The method of claim 18, wherein said oxide layer of said composite barrier layer is formed in a batch furnace system.

28. The method of claim 18, wherein said oxide layer of said composite barrier layer is formed to a thickness of about 20 Angstroms to about 500 Angstroms.

29. The method of claim 18, wherein said oxide layer of said composite barrier layer is formed to a thickness of about 50 Angstroms to about 100 Angstroms.

30. The method of claim 18, wherein said barrier layer of said composite barrier layer is formed of an insulating material selected from the group consisting of silicon nitride, silicon oxide, silicon dioxide, silicon carbide and high temperature polymers.

31. The method of claim 18, wherein said barrier layer of said composite barrier layer is formed to a thickness of about 50 Angstroms to about 100 Angstroms.

32. The method of claim 18, wherein said composite barrier layer is further formed over said plurality of gate stacks including said spacers formed on sidewalls of each of said plurality of gate stacks.

33. The method of claim 18, wherein said glass insulating layer is a doped glass film.

34. The method of claim 33, wherein said doped glass film includes BPSG material.

35. The method of claim 33, wherein said doped glass film includes PSG material.

36. A method of preventing the diffusion of atoms from a glass insulating layer into a source/drain region formed between adjacent gate stacks of a memory device, comprising:
forming spacers on sidewalls of said gate stack; and
subsequently forming a composite barrier layer over said source/drain region and said adjacent gate stacks including said spacers, said composite barrier layer comprising an oxide layer formed to a thickness of about 50 Angstroms to about 100 Angstroms by oxidizing approximately an entire upper surface of said source/drain region using atomic oxygen so that said oxide layer has a first oxide portion of a first thickness over said spacers and a second oxide portion over said source/drain regions of a second thickness, said first thickness being about 60% of said second thickness, and a barrier layer formed over said oxide layer.

37. The method of claim 36, wherein said oxide layer of said composite barrier layer is grown at a temperature of about 850° C. to 1100° C.

38. The method of claim 36, wherein said oxide layer of said composite barrier layer is grown at a temperature less than about 900° C.

39. The method of claim 36, wherein said oxide layer of said composite barrier layer is grown for about 1 second to about 10 minutes.

40. The method of claim 36, wherein said atomic oxygen is supplied by in situ steam generation.

41. The method of claim 36, wherein said atomic oxygen is supplied by an ozone source.

42. The method of claim 36, wherein said atomic oxygen is supplied by a plasma source.

43. The method of claim 36, wherein said atomic oxygen is supplied by a microwave source.

44. The method of claim 36, wherein said atomic oxygen is supplied by photoexcitation.

45. The method of claim 36, wherein said barrier layer of said composite barrier layer is formed of an insulating material selected from the group consisting of silicon nitride, silicon oxide, silicon dioxide, silicon carbide and high temperature polymers.

46. The method of claim 36, wherein said barrier layer of said composite barrier layer is formed to a thickness of about 30 Angstroms to about 150 Angstroms.

47. The method of claim 36, wherein said barrier layer of said composite barrier layer is formed to a thickness of about 50 angstroms to about 100 angstroms.

48. The method of claim 36, wherein said glass insulating layer is a doped glass film.

49. The method of claim 48, wherein said doped glass film includes BPSG material.

50. The method of claim 48, wherein said doped glass film includes PSG material.

* * * * *